US011817876B2

(12) United States Patent
Michaelsen et al.

(10) Patent No.: US 11,817,876 B2
(45) Date of Patent: Nov. 14, 2023

(54) RECEIVER

(71) Applicant: Novelda AS, Kviteseid (NO)

(72) Inventors: Jørgen Andreas Michaelsen, Oslo (NO); Nikolaj Andersen, Oslo (NO); Olav Tonnaer Liseth, Oslo (NO); Håkon André Hjortland, Oslo (NO)

(73) Assignee: Novelda AS, Kviteseid (NO)

( * ) Notice: Subject to any disclaimer, the term of this patent is extended or adjusted under 35 U.S.C. 154(b) by 871 days.

(21) Appl. No.: 16/483,166

(22) PCT Filed: Feb. 1, 2018

(86) PCT No.: PCT/EP2018/052581
§ 371 (c)(1),
(2) Date: Aug. 2, 2019

(87) PCT Pub. No.: WO2018/141879
PCT Pub. Date: Aug. 9, 2018

(65) Prior Publication Data
US 2020/0007140 A1    Jan. 2, 2020

(30) Foreign Application Priority Data
Feb. 3, 2017  (GB) ..................... 1701848

(51) Int. Cl.
H03M 1/12      (2006.01)
G01S 7/292     (2006.01)
G01S 13/02     (2006.01)

(52) U.S. Cl.
CPC ......... H03M 1/1245 (2013.01); G01S 7/2922 (2013.01); G01S 7/2927 (2013.01); G01S 13/0209 (2013.01)

(58) Field of Classification Search
CPC .. G01S 13/0209; G01S 7/2922; G01S 7/2927; H03M 1/121; H03M 1/1245; H03M 1/502
See application file for complete search history.

(56) References Cited

U.S. PATENT DOCUMENTS 5,257,312 A * 10/1993 Therssen ............. H04B 1/1646
                                                      381/13
8,013,789 B2    9/2011 Van Graas et al.
(Continued)

FOREIGN PATENT DOCUMENTS

CN    201855273 U    6/2011
CN    104134373 A    11/2014
(Continued)

OTHER PUBLICATIONS

Hjortland et al., "CMOS Impulse Radar," *2006 NORCHIP*, Nov. 2006, 5 pages.
(Continued)

Primary Examiner — Timothy X Pham
(74) Attorney, Agent, or Firm — Klarquist Sparkman, LLP

(57) ABSTRACT

A range profile digitization circuit for converting a repeating analog input signal into a time series of digital amplitude values, the converter comprising: a signal quantizer arranged to receive the analog input signal and a threshold input and arranged to output a binary value quantized output signal based on a comparison of the input signal with the threshold signal; a plurality of samplers each arranged to sample and hold its input signal upon receipt of a trigger signal; and for each sampler: a plurality of decoders and a demultiplexer arranged to receive an output from the sampler and pass it to a selected one of said decoders based on a selector input. With a plurality of decoders associated with (Continued)

each of the samplers, each sampler can be re-used during the building up of the range profile.

7 Claims, 3 Drawing Sheets

(56) References Cited

U.S. PATENT DOCUMENTS

| | | | |
|---|---|---|---|
| 8,953,950 B2 | 2/2015 | Nazarathy et al. | |
| 9,083,347 B1* | 7/2015 | Remla | H03K 21/38 |
| 2010/0305449 A1 | 12/2010 | Wegener et al. | |
| 2011/0244811 A1* | 10/2011 | Kargl | H04L 25/068 |
| | | | 455/73 |
| 2013/0100250 A1 | 4/2013 | Raskar et al. | |
| 2013/0181746 A1* | 7/2013 | Granhaug | G01S 13/18 |
| | | | 327/77 |
| 2014/0292551 A1 | 10/2014 | Kull et al. | |
| 2016/0248438 A1* | 8/2016 | Lachartre | H03M 3/424 |
| 2018/0239013 A1* | 8/2018 | Lande | G01S 13/904 |

FOREIGN PATENT DOCUMENTS

| | | |
|---|---|---|
| TW | I543538 B | 7/2016 |
| WO | WO 2011/010314 A2 | 1/2011 |
| WO | WO 2014/123433 A1 | 8/2014 |

OTHER PUBLICATIONS

Hjortland et al., "CTBV Integrated Impulse Radio Design for Biomedical Applications," *IEEE Translactions on Biomedical Circuits and Systems*, vol. 3, No. 2, Apr. 2009, 10 pages.

Hjortland, "UWB impulse radar in 90 nm CMOS," Master thesis, University of Oslo Department of Informatics, Aug. 7, 2006, 120 pages.

Office action for Taiwan Application No. 107103796 (w/ English translation), dated Mar. 23, 2021, 11 pages.

Hjortland et al., "CMOS Impulse Radar, " 24*th* Norchip Conference, Nov. 2006, pp. 75-79.

Hjortland et al., "CTBV Integrated Impulse Radio Design for Biomedical Applications," IEEE Transactions on Biomedical Circuits and Systems, vol. 3, No. 2, Apr. 2009, pp. 79-78.

Hjortland et al., "Thresholded samples for UWB impulse radar," IEEE International Symposium on Circuits and Systems, May 2007, pp. 1210-1213.

International Search Report and Written Opinion for PCT/EP2018/052581, dated Jul. 27, 2018, 23 pages.

Office Action issued in China Application No. 201880010257.1, dated Sep. 15, 2022, 22 pages.

Office Action issued in Taiwan Application No. 11121125750, dated Nov. 16, 2022.

Decision of Rejection (with English translation) issued in corresponding China Application No. 201880010257.1, dated Feb. 25, 2023, 16 pages.

* cited by examiner

RECEIVER

CROSS REFERENCE TO RELATED APPLICATIONS

This is the U.S. National Stage of International Application No. PCT/EP2018/052581, filed Feb. 1, 2018, which was published in English under PCT Article 21(2), which in turn claims the benefit of Great Britain Application No. 170848.2, filed Feb. 3, 2017.

The invention relates to a signal receiver and processor, especially for use in impulse radar applications such as ultra-wide band (UWB) radar. In particular, the invention provides a high speed range profile digitization circuit which receives an analog signal and produces a digital representation of it.

By way of background, an existing receiver architecture for receiving signal waveforms in an impulse radar system using a swept threshold digitization circuit is illustrated in FIG. 1.

FIG. 1a shows a comparator 10 that receives the received (RX) signal 12 and a threshold signal 14. The comparator is a standard 1-bit comparator. It compares the two inputs and outputs a high signal (high voltage rail) if the received signal 12 is higher than the threshold 14 and a low signal (low voltage rail) otherwise, thus quantising the incoming received signal 12. Pulses are transmitted repeatedly at a pulse repetition frequency (PRF). After each pulse is transmitted the threshold signal 14 is changed and the comparison is performed again, thus comparing the received signal 12 against a different threshold (for a high PRF, the received signal is expected to be substantially identical for successive pulses as any movement of reflectors within the range is assumed to be slow compared with the pulse repetition rate, i.e. it is assumed that the reflected signal closely matches the preceding and following signals). By sweeping the threshold signal 14 through a predefined range of voltages in small increments, a thermometer code of the signal level is produced. By counting (and hence summing over time) the comparator output after each pulse (the counter 16 incrementing if the comparator 10 outputs high and not incrementing if the comparator 10 outputs low), the thermometer coded output is turned into a multi-bit sample value of the received signal 10. In the following, the term "swept-threshold" is used to describe this technique.

In FIG. 1a the counter 16 is triggered by the trigger signal 18 that was also used to generate transmit (TX) pulses. A delay 20 provides the overall coarse range gate, i.e. the time at which to start sampling the receive signal 12 (and thus the distance or range at which to look for reflections). FIG. 1b illustrates the signals involved, with the trigger signal shown at the top (four individual pulses in the pulse stream are shown, these being generated at the PRF), the transmit pulse that is generated by that trigger signal is shown on the second line, the received signal 12 on the third line (showing two reflections from each transmit pulse) and the step-wise increasing threshold signal 14 on the fourth line.

For the most accurate digitization of the receive signal, the sampling rate should be maximised (i.e. the time between samples minimised), bearing in mind that there is no theoretical benefit to sampling at higher than the Nyquist frequency. Traditional (non-swept-threshold) receivers are limited by the speed of the ADCs as the next sample cannot be taken until the ADC has finished processing the previous sample. High resolution (i.e. with a high number of bits of digital output) ADCs are typically too slow to sample the RF signal directly and therefore there has traditionally been a trade-off between time resolution and amplitude resolution. With the swept-threshold architecture, high resolution can be obtained in both time and amplitude by using a comparator as a 1-bit (and very fast) ADC for excellent time resolution and by making use of a periodic repetitive signal, sending a large number of pulses and varying the threshold between pulses to obtain the desired amplitude resolution.

There is also a trade-off between the range that is sampled and the frame rate at which that range is refreshed. For example, if a 1 metre range can be fully sampled 100 times per second (frame rate of 100 Hz), the same PRF could equally be used to examine a 10 metre range at a frame rate of only 10 frames per second.

Although this system could be used to examine each range point in full (i.e. at all thresholds) before moving on to the next range point, this does not make efficient use of the transmitted pulses. For example, for a 13-bit output, 8192 pulses are required for each range point. At a PRF of 10 MHz, 256 range points could only be sampled 4 times per second which is too small a frame rate for many applications. Therefore in a preferred architecture several range points are sampled in parallel; the receive signal for a single transmit pulse is sampled by several parallel samplers each operating at a different delay time (i.e. each providing a different sampling point or range point). The resulting thermometer coded output is shown in FIG. 1c, showing the pulse shape of a received pulse in the receive signal 12 (in this case a Gaussian derivative pulse), built up over a full sweep of thresholds. It will be appreciated that the individual samples are taken at a much higher frequency than the PRF, consecutive sampling times being illustrated (not to scale) by the arrows labelled $t_0$, $t_1$ and $t_2$ in both FIGS. 1b and 1c.

An implementation with multiple parallel counters 16 is shown in FIG. 2. In this existing architecture the counters 16 are individually driven by a trigger signal 18 tapped through a series of delay elements 22 constituting an open-loop delay line 20. The taps of the delay line (taken from between adjacent delay elements 22) enable the counters 16 to sample and process the quantized signal from the comparator 10, each counter being for a different range point. Thus in this implementation there is one sampler for each counter 16 and one counter 16 for each range point (sampling point) in the range profile.

In the existing radar receive architecture shown in FIG. 2, the receive signal 12 is converted into a single-ended rail-to-rail CMOS digital signal by the comparator 10 as follows: the comparator 10 sums the receive signal 12 with the swept threshold signal 14 and compares this summed signal with a fixed input reference the value of which is determined from physical circuit parameters. Depending on whether the summed input is higher or lower than the reference, the output is driven to the high or low rail. The comparator applies linear gain which saturates at the supply rails, producing a signal with digital (binary) levels.

A disadvantage of this arrangement is that the quantised output signal has finite rise and fall times that vary the pulse width (i.e. times between edges). If the rise times and fall times are too slow (not steep enough) then the width of the pulses can be reduced to the extent that they are insufficient to trigger the downstream logic or sampling latch. This may result in missed counts and erroneous signal digitisation. This is particularly the case with a continuous-in-time signal as rising edges and falling edges can come very close together. The setup and hold requirements of the sampling latch may thus lead to unpredictable results. The impulse sampling that is desired is not achieved because the sampling instant is not well defined. Also, the rail-to-rail CMOS signal generates a significant amount of switching noise at high frequencies which is undesirable, as well as drawing significant power (because power is proportional to $C \times V_{dd}^2 \times f$, where C is the capacitive load, $V_{dd}$ is the supply voltage, i.e. the high level of the signal, and f is the switching frequency).

According to an aspect of the invention there is provided a range profile digitization circuit for converting a repeating analog input signal into a time series of digital amplitude values, the converter comprising: a signal quantizer arranged to receive the analog input signal and a threshold input and arranged to output a binary value quantized output signal based on a comparison of the input signal with the threshold signal; a plurality of samplers each arranged to sample and hold its input signal upon receipt of a trigger signal; and for each sampler: a plurality of decoders and a demultiplexer arranged to receive an output from the sampler and pass it to a selected one of said decoders based on a selector input.

By providing a plurality of decoders associated with each of the samplers, each sampler can be re-used during the building up of the range profile. To build up the range profile of the signal a decoder is required for each range point in order to convert the thermometer coded input into a digital value. The decoder values may be generated by storing and accumulating the individual bits of the thermometer coded input over multiple pulse transmissions (each bit resulting from a comparison against a threshold value in the swept threshold system). The decoder values provide the amplitude resolution. Counters are one convenient form of decoder. A counter can be arranged to receive the quantized input and either increase its count or not increase its count based on the quantized input. An alternative decoder is a thermometer to binary decoder one form of which may store up the input bits until an output value is required and then process them simultaneously to produce the required output value.

In previous designs, the counters have all been connected to the received (and quantized) signal in parallel, each with its own sample and hold circuit and each being triggered in sequence so as to sample the receive signal and different times (and hence different range points). However, the large counter circuits provide a capacitive load on the circuit which slows down the rise and fall times of the quantized signal and can, in extreme cases, result in the quantized signal rising too slowly to trigger the counter. By re-using the samplers and providing each sampler with multiple decoders (e.g. counters) accessed via a demultiplexer, the decoders become effectively isolated from the upstream circuit components as only one decoder for each sampler is ever connected at one time. Thus the capacitive load is significantly reduced and the rise and fall times of the quantizer are not slowed so much. As a consequence, the signal can be captured more reliably as there is a much smaller chance of the decoders failing to activate when required. The speed of the decoders themselves is not a problem as each decoder does not need to finish its processing before the demultiplexer moves on to the next decoder. It only needs to have commenced processing (although of course it also needs to finish before the next cycle). The re-use of the samplers does require a slightly more complex triggering logic and counting logic to control the timing of the samplers and the switching between the different decoders (i.e. controlling the demultiplexers), but the gains in reliability and area saving have been found to justify this complexity.

Preferably the range profile digitization circuit further comprises a controller arranged to generate trigger signals for the plurality of samplers, the trigger signals being generated at regular time intervals. The trigger signals could be generated by an open loop delay line such that when a trigger signal is transmitted along the delay line, the delay line taps provide a series of trigger signals in time. However, at high speeds it can be difficult to ensure the timing reliability of a pure open loop delay line as variations in the temperature and the manufacturing process cause differences in operation between different devices and differences across operating temperatures. Therefore in preferred embodiments the controller provides triggers at regular time intervals generated by some form of clock or regulated circuit. For example a delay locked loop (DLL) or a phase locked loop (PLL) provides a good regular timing mechanism, especially when it is driven from a stable oscillator (or other reference source) such as a crystal oscillator. Although such clocks consume more power than a pure delay line solution, this power consumption is at least partly compensated by the power saving of having a lower parasitic capacitance in the sampling circuitry (as the decoders are better isolated as described above).

While it is conceivable that in some embodiments there could be a time gap between the last sampler in the series being triggered and the first sampler in the series being triggered for the next cycle, it is preferred that the controller be arranged to generate a continuous stream of trigger signals comprising a plurality of cycles of the plurality of samplers. Thus the time interval between the last sampler being triggered and the first sampler being triggered again (i.e. the time gap between the end of one sampler cycle and the beginning of the next) is substantially the same as the time gap between other pairs of temporally adjacent sample triggers. Thus the re-use of the samplers provides a continuous stream of samples, all separated by substantially the same time gap and thus providing regular samples of the range profile.

In particularly preferred embodiments the controller comprises a multiphase frequency generator arranged to generate the trigger signals. A multiphase frequency generator is beneficial as it can operate at a much lower base clock frequency that draws less power. The multiple phases of the frequency generator are used as the trigger signals for the samplers. Thus the multiphase frequency generator preferably outputs a number of phases equal to the number of samplers. With the number of phases exactly matched to the number of samplers, the samplers will be cycled continuously as described above. A PLL or DLL may be used for the multiphase frequency generator. It will be appreciated that the circuit components such as samplers are typically edge triggered and thus it is the frequency of edge generation of the multiphase frequency generator that determines the actual sampling rate. In this case the sampling rate is equal to the base (or external reference) frequency of the multiphase clock generator multiplied by the number of phases that it generates (i.e. the number of samplers). In some preferred embodiments an additional clock multiplier may be used to further increase the overall frequency. For example an ×8 clock multiplier can be used to further increase the base clock frequency used by the multiphase frequency generator. For example if a PLL is used, it is straight forward to have the PLL multiply the input clock frequency (and output a multiphase clock).

The range profile digitization circuit preferably further comprises a controller arranged to generate selector inputs for the demultiplexers, the controller being arranged to change the selector input of each demultiplexer every time the corresponding sampler is triggered. Each time the full set of the plurality of samplers is used once, a decoder (e.g. a counter) of each sampler is used as a range point measurement. Thus for the next pass (re-use of the samplers) a different decoder must be used to measure a different range point. Thus between samples being taken by each sampler, the selector input of the associated demultiplexer must be changed so as to direct the next sample to the next decoder. In this way the full set of decoders is used to measure a full set of range points. This process is typically used to sample the reflected profile of a single transmit pulse. Once all decoders have been used, the samplers will be disabled until the next transmit pulse is sent (and optionally also a coarse range gate delay has elapsed before measurement starts). The controller will reset the demultiplexer selector inputs so that for the next transmit pulse the new range profile measurements begin again at the first decoder of each sampler so that the same range profile is processed along with the previous corresponding sample (e.g. in the case of a counter, it is counted on top of the previous counts), but with a new threshold level set as described above. This process repeats until all thresholds have been processed. At the end of this process the decoders together provide a time series (i.e. an array) of digital values representing the amplitude of the received signal, i.e. a digitized range profile.

It will be appreciated that, while two separate controllers could be used (e.g. a multiphase clock to drive the samplers and a separate timing controller to drive the demultiplexers), a single controller can of course be used to control both the sampler trigger signals and the demultiplexer selector inputs (such a controller may include a multiphase clock as described elsewhere). Thus preferably the controller is arranged to generate trigger signals for the plurality of samplers and selector inputs for the demultiplexers; and wherein the controller is arranged to generate trigger signals that cycle through the plurality of samplers a plurality of times; and wherein the controller is arranged to cycle through the demultiplexer selector inputs, changing each demultiplexer's selector input once per cycle of the trigger signals.

It will be appreciated that the above architecture can be used with any given frequencies of pulse transmission and sampling. However, by way of example, in some embodiments the pulse repetition frequency is at least 10 MHz, preferably at least 20 MHz, optionally at least 50 MHz. The base clock frequency of the multiphase frequency generator may be at least 100 MHz, preferably at least 200 MHz. In some embodiments at least 5 samplers are provided, more preferably at least 10 samplers. In some embodiments each sampler has at least 20 decoders, preferably at least 50 decoders, more preferably at least 100 decoders.

In one specific, non-limiting example, the range profile digitization circuit comprises 12 samplers, each with 128 decoders, thereby providing 1536 sampling points (range points) in the range profile. The multiphase frequency generator has a base (or reference) frequency of 243 MHz, includes a ×8 multiplier, and generates 12 phases of the multiphase clock signal to provide an overall sampling rate of 243×8×12=23.328 GS/s (Gigasamples per second).

The sampler may be any form of sampler circuit, but for high speed operations a simple and fast circuit is preferred and therefore preferably the samplers are flip-flops. For example a D-type flip-flop is suitable for this circuit.

In some embodiments a single quantizer is provided upstream of all of the plurality of samplers. This can be a benefit by ensuring that there is no mismatch between different quantizers. However, in alternative and preferred embodiments a plurality of quantizers is provided, each being associated with one or more of the plurality of samplers. With multiple quantizers, the threshold signal would be distributed to each quantizer. Although the number of quantizers could be lower than the number of samplers, with each quantizer fanning out its output to multiple samplers, it is preferred in such arrangements that one quantizer be provided for each sampler. Advantages of such arrangements will be discussed further below. Where a plurality of quantizers and a plurality of samplers are provided, the order of quantization and sampling can be either way round. For example the signal can be quantized immediately prior to sampling the quantized signal. Alternatively, and preferably, the non-quantized signal may be sampled first by the sampler and then the sampled output can be quantized, e.g. by amplifying it to either voltage rail.

According to another aspect, the invention provides a method of range profile digitization for converting a repeating analog input signal into a time series of digital amplitude values, the digitization comprising: comparing the received analog input signal with a threshold input and quantizing the analog input signal based on said comparison to output a binary value quantized output signal; sampling the signal by a plurality of samplers each arranged to sample and hold the signal upon receipt of a trigger signal; and for each sampler: directing the output from the sampler to a selected one of a plurality of decoders associated with that sampler based on a selector input.

It will be appreciated that all of the preferred and optional features described above may be applied equally to this method.

As mentioned earlier, in previous swept threshold designs the received (RX) signal from the antenna is converted into a single-ended, rail-to-rail CMOS digital signal early in the processing chain such that the signal is quantized before it is fanned out to the multiple samplers and decoders. As discussed above, there are disadvantages to this arrangement in that the rise and fall times can be too slow, resulting in narrow pulses that fail to trigger the samplers and also high switching noise at high frequencies.

According to another aspect of the invention there is provided a range profile digitization circuit for converting a repeating analog input signal into a time series of digital amplitude values, the converter comprising: a differencer arranged to receive the analog input signal and a threshold input signal and arranged to output a differencer signal being the difference between the analog input signal and the threshold input signal; a plurality of clocked comparators, each clocked comparator being arranged to sample the differencer signal upon receipt of a trigger signal and each clocked comparator being arranged to output and hold an amplified signal; and for each clocked comparator, a decoder which is arranged to decode the quantized signal into a digital value.

The use of a differencer without a quantizer in the early part of the processing chain means that the signal is not quantized (discretized into one of two binary values) until later in the processing chain. The quantization does not take place until the clocked comparators. The clocked comparators amplify the signal into one of two discrete binary values (i.e. quantizing it by amplifying the signal until it reaches a rail voltage). The regenerative amplification of these clocked comparators has an exponential response and therefore provides a very high gain for resolving small differences between the threshold level and the signal into levels that subsequent circuits can respond to. As the clocked comparator is a clocked device, it samples, amplifies and holds the amplified value. Importantly, quantization of the signal is avoided prior to sampling of the signal. Only after sampling is the sampled value quantized accordingly. This arrangement (as compared with previous designs in which the signal was quantized early in the signal processing) allows the use of regenerative gain in the quantization process as this takes place after sampling (and hence in a clocked part of the circuit rather than in a continuous time part of the circuit). Due to the extremely high gain of the regenerative amplifier, the output will be a binary value as the amplifier rapidly pushes the output to one of the circuit's voltage rails. This output value is passed to the corresponding decoder which, when enabled or triggered, adjusts its value based on that binary value.

With this arrangement the switching noise is removed or reduced as the regenerative amplification (and switching) only happens immediately after the sampling and prior to the counting operations. Thus the noise occurs at predefined points in time and not when the circuit is sampling the input signal. So noise is less likely to interfere during the critical sampling phase.

Accordingly, the range profile digitization circuit preferably comprises a continuous time amplifier downstream of the differencer, and arranged to amplify the differencer signal.

The use of a continuous-time (non-regenerative) amplifier early in the signal chain amplifies the incoming signal for use later in the processing chain without pushing the received signal to the rails and without generating switching noise. The signal is not made discrete in amplitude (binary value) until it reaches each of the plurality of clocked comparators.

Additionally, as the continuous-time, non-regenerative amplifier amplifies the difference between the received signal and the threshold signal, the output can be analysed by examining its polarity (i.e. amplitude with respect to ground) rather than absolute values. As the polarity can be distinguished much more sensitively, a low gain can be used at this stage, improving the signal to noise ratio without introducing switching noise. A limiting gain continuous time amplifier can be used as a buffer to enhance the sensitivity of the quantizers. Limiting gain is possible because we only need the polarity of the signal and helps slew rate requirements. It is not a problem for the signal to clip. i.e. for the output to have some maximum and minimum value, as it is only the polarity of the signal that matters. However it should be noted that the signal does not have to clip, because the regenerative gain will continue the amplification to digital levels later in the processing.

The system may have a single difference provided before the signal is fanned out to the clocked comparators. This has the advantage of not having to fan out the threshold signal. However, it is also possible for a plurality of differencers to be provided, each with its own threshold input and positioned after the signal has been distributed to the clocked comparators. Thus the range profile digitization circuit may comprise a plurality of differencers, one for each clocked comparator and each arranged to receive the analog input signal and the threshold input signal and arranged to output a differencer signal being the difference between the analog input signal and the threshold input signal to its associated clocked comparator. The differencer may be an integral part of the clocked comparator circuit. In alternative embodiments there may be a plurality of differencers each connected to a plurality of clocked comparators in a tree like structure.

This quantizing scheme can be used with the traditional swept threshold architecture with all decoders (counters) provided in parallel and each in association with its own clocked comparator. However, for additional benefits it can also be used with the sampler re-use techniques described above.

Accordingly, the range profile digitization circuit may comprise, for each clocked comparator, a plurality of decoders and a demultiplexer arranged to receive the amplified output from the clocked comparator and pass it to a selected one of said decoders based on a selector input. The range profile digitization circuit may further comprise a controller arranged to generate trigger signals for the plurality of clocked comparators, the trigger signals being generated at regular time intervals. The controller may be arranged to generate a continuous stream of trigger signals comprising a plurality of cycles of the plurality of clocked comparators. The range profile digitization circuit may further comprise a controller arranged to generate selector inputs for the demultiplexers, the controller being arranged to change the selector input of each demultiplexer every time the corresponding clocked comparator is triggered.

The controller may be arranged to generate trigger signals for the plurality of clocked comparators and selector inputs for the demultiplexers; and the controller may be arranged to generate trigger signals that cycle through the plurality of clocked comparators a plurality of times; and the controller may be arranged to cycle through the demultiplexer selector inputs, changing each demultiplexer's selector input once per cycle of the trigger signals.

In preferred embodiments each clocked comparator is formed from a strong-arm latch. A strong-arm latch has the advantages of providing the sampling, comparison and regenerative gain/quantizing functions all in one convenient circuit. The strong-arm latch operates in there phases, firstly a sampling phase, secondly a comparison/regenerative gain and quantizing phase and thirdly a reset phase. As discussed above, the sampling of the receive signal is effected prior to quantizing of it, allowing regenerative gain to be used in the quantization process. However, it will be appreciated that the strong-arm latch is only one specific circuit design that can be used to achieve the sampling and quantization goals. Other circuits may also be used instead of a strong-arm latch.

The clocked comparator may be arranged to generate a high or low output based on the polarity of the incoming signal.

According to a further aspect, the invention provides a method of range profile digitization for converting a repeating analog input signal into a time series of digital amplitude values, the digitization comprising: taking the difference between the received analog input signal and a threshold input signal; providing the difference signal to a plurality of clocked comparators; each clocked comparator sampling the difference signal upon receipt of a trigger signal and outputting an amplified signal; and for each clocked comparator, decoding the quantized signal to produce a digital value.

It will be appreciated that all of the preferred and optional features described above may be applied equally to this method.

While the above description describes a range profile digitization circuit, e.g. for an impulse radar, it will be appreciated that the circuits may also be used for other analog to digital conversion purposes. Thus according to another aspect, there is provided an analog to digital convertor for converting a repeating analog input signal into a time series of digital amplitude values, the converter comprising: a signal quantizer arranged to receive the analog input signal and a threshold input and arranged to output a binary value quantized output signal based on a comparison of the input signal with the threshold signal; a plurality of samplers each arranged to sample and hold its input signal upon receipt of a trigger signal; and for each sampler: a plurality of decoders and a demultiplexer arranged to receive an output from the sampler and pass it to a selected one of said decoders based on a selector input.

Also, according to a further aspect the invention provides an analog to digital converter (ADC) for converting a repeating analog input signal into a time series of digital amplitude values, the converter comprising: a differencer arranged to receive the analog input signal and a threshold input signal and arranged to output a differencer signal being the difference between the analog input signal and the threshold input signal; a plurality of clocked comparators, each clocked comparator being arranged to sample the differencer signal upon receipt of a trigger signal and each clocked comparator being arranged to output and hold an amplified signal; and for each clocked comparator, a decoder which is arranged to decode the quantized signal into a digital value.

It will be appreciated that the corresponding methods can also be applied to analog to digital conversion generally.

Preferred embodiments of the invention will now be described, by way of example only, and with reference to the accompanying drawings in which.

FIGS. 1a, 1b, 1c and 2 were described in detail earlier in this document and are therefore not further described here.

Figure 1A:
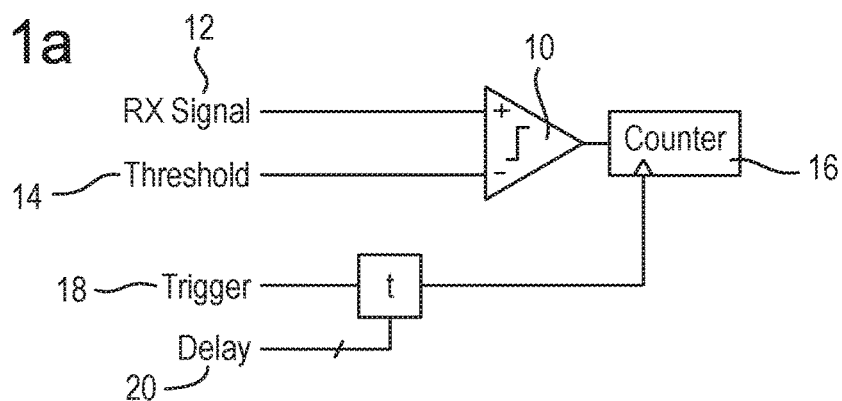
FIG. 1a shows the basic structure of a swept-threshold receiver.
Figure 1B:
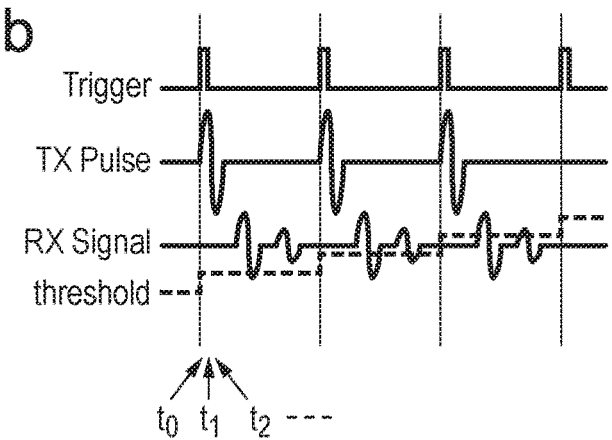
FIG. 1b shows waveforms for a swept-threshold receiver operation.
Figure 1C:
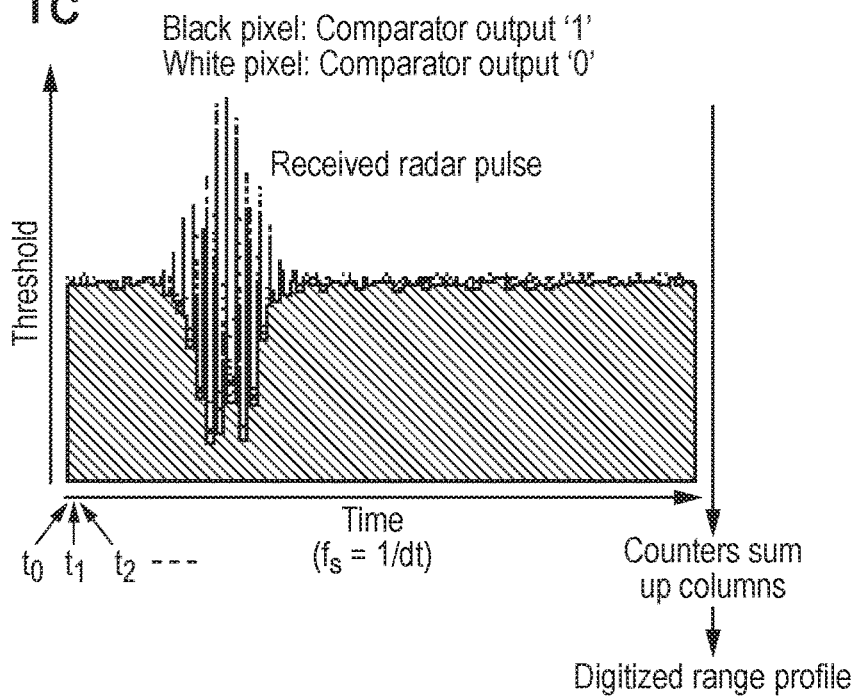
FIG. 1c shows a portion of an example digitized range profile.
Figure 3:
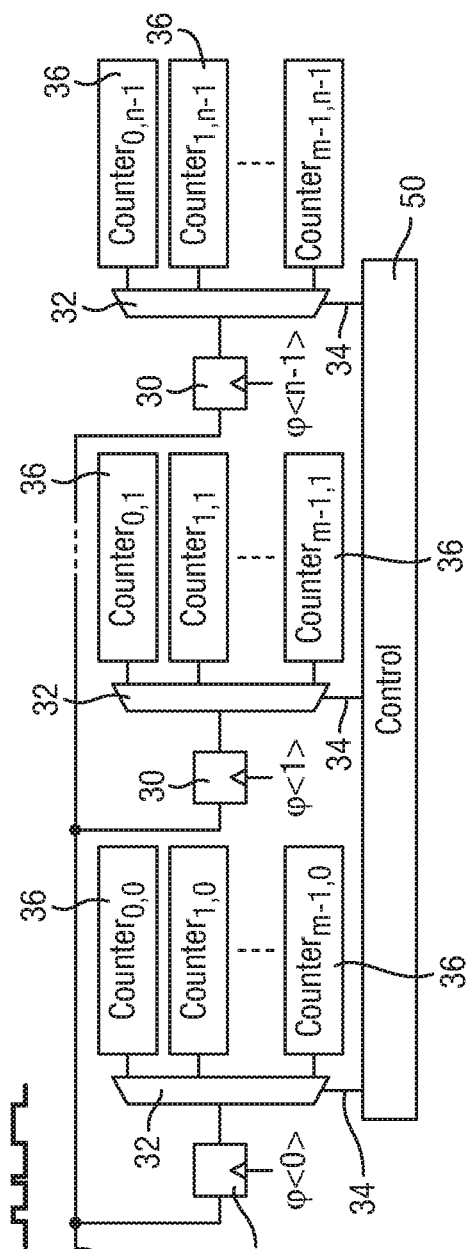
FIG. 3 shows a receiver architecture according to an embodiment of the invention.

FIG. 3 shows an impulse radar receiver architecture that operates on the swept threshold principle described and illustrated in relation to FIGS. 1a, 1 b, 1c and 2. The received signal (including reflections of the transmitted signal) 12 and a threshold signal 14 are provided as inputs to a quantizer 10 that outputs a quantized signal 11 that is either high or low (voltage rails) depending on the comparison of the received signal 12 with the threshold signal 14. The quantized signal 11 is still a continuous-time (non-clocked) signal, with a binary value (high or low). This quantized signal 11 is then fanned out to a plurality of samplers 30 which operate in parallel.

Figure 2:
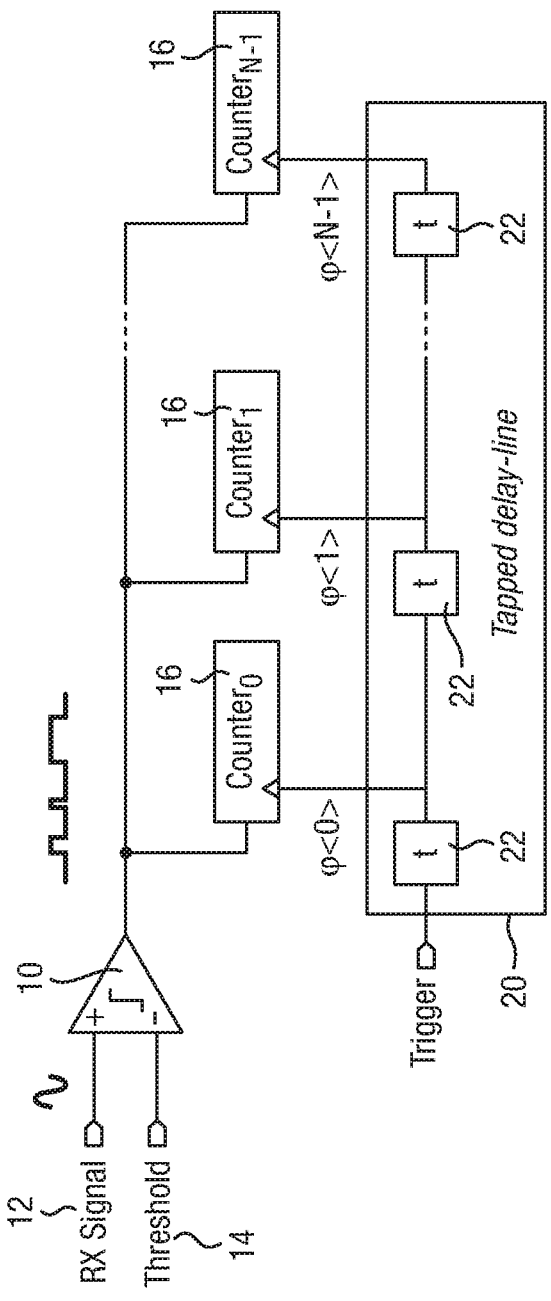
FIG. 2 illustrates an example of a swept-threshold receiver architecture.
Figure 4:
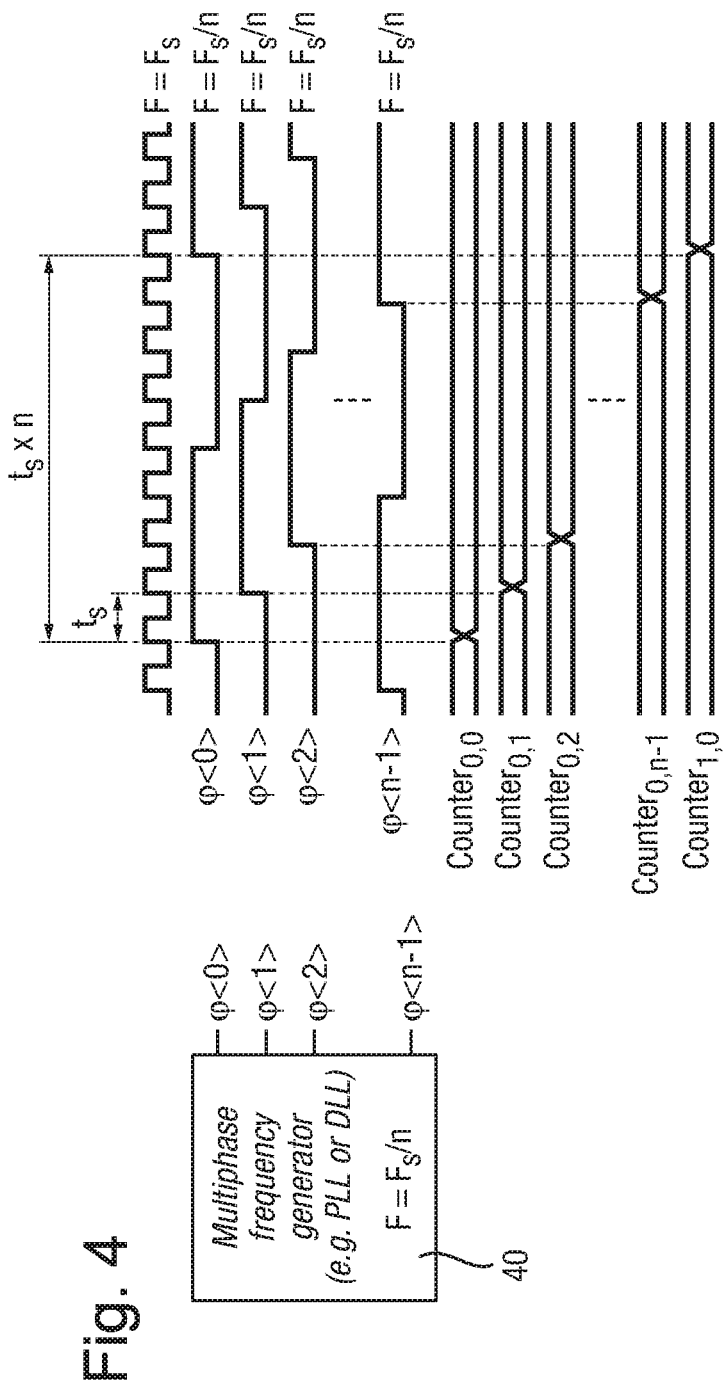
FIG. 4 shows waveforms associated with use of the architecture shown in FIG. 3.

Whereas in FIG. 2 the counters 16 were triggered by the taps of a non-clocked delay line, in this embodiment (FIG. 3) the samplers 30 are triggered by the phase outputs $\varphi<n>$ from a multiphase frequency generator (multiphase clock) 40. The outputs $\varphi<0>$ to $\varphi<n-1>$ of multiphase clock 40 are shown in the upper half of FIG. 4, all having the same frequency $F=F_s/n$, but each being offset by a different amount. The outputs $\varphi<0>$ to $\varphi<n-1>$ are equally spaced from one another and $\varphi<n-1>$ is also equally spaced from the $\varphi<0>$ of the next $F_s$ in clock cycle. The top row of FIG. 4 illustrates the overall effective sampling rate $F_s$ with time period $t_s$, although it will be appreciated that this is not a real signal appearing anywhere in the circuit of FIG. 3.

As each sampler 30 is triggered by its corresponding clock phase signal $\varphi<0>$ to $\varphi<n-1>$, it samples its continuous-time, binary value input 11 and holds that value for the duration of its clock phase until it is next required to sample the input again. The plurality of samplers 30 each receive a different clock phase $\varphi<0>$ to $\varphi<n-1>$ such that they sample the quantized signal 11 at different times and thus sample different range points in the received signal (different range points in the range profile). Each sampler 30 may be a D-type flip-flop.

The output of each sampler 30 is passed to the input of a demultiplexer 32. Each demultiplexer 32 can direct its input to one of several different outputs, depending on the selector input 34 which is provided by controller 50. The different outputs of the demultiplexer 32 are each provided to a different counter 36 (being a form of decoder) each of which is arranged to increase its count by one upon receipt of a high signal and not to increase its count when its input is low.

Once per clock phase cycle (i.e. at a frequency Fs/n), the controller 50 changes the selector input 34 to select the next counter in the series, i.e. to move the demultiplexer output on to the next counter. Thus for example the demultiplexer 34 attached to the sampler 30 that is driven by clock phase $\varphi<0>$ initially directs its output to counter$_{0,0}$. In the next cycle of clock phase $\varphi<0>$, the next sample from sampler 30 is directed to counter$_{1,0}$ and the next sample is directed to counter$_{2,0}$, etc. up to the final counter$_{m,0}$. Similarly the demultiplexer 34 attached to the sampler 30 that is driven by clock phase $\varphi<1>$ initially directs its output to counter$_{0,1}$. In the next cycle of clock phase $\varphi<1>$, the next sample from sampler 30 is directed to counter$_{1,1}$ and the next sample is directed to counter$_{2,1}$, etc. up to the final counter$_{m-1,1}$. In this way, each counter 36 represents a different range point in the range profile in the sequence counter$_{0,0}$, counter$_{0,1}$, counter$_{0,2}$, . . . , counter$_{0,n-1}$, counter$_{1,0}$, counter$_{1,1}$, counter$_{1,2}$, . . . , counter$_{1,n-1}$, . . . , counter$_{m-1,0}$, counter$_{m-1,1}$, counter$_{m-1,2}$, . . . , counter$_{m-1,n-1}$. The counting of the various counters 36 is illustrated in the lower half of FIG. 4, each counter being represented by a pair of lines and a crossing of those lines indicating a change of state (i.e. an increase in counter value).

The use of the multiphase clock 40 allows multiple adjacent samples to be taken at closely spaced time points without requiring a single fast clock and sampler (i.e. the sampler is distributed). The provision of multiple counters 36 per sampler 30 reduces the number of parallel samplers 30 that are required to provide a full range profile (i.e. the samplers are re-used). The counters 36 are isolated from the quantizer 10 and thus reduce the capacitive load that is seen by the quantizer 10 and thus producing less impact on the rise and fall times of the quantized signal 11.

Figure 5:
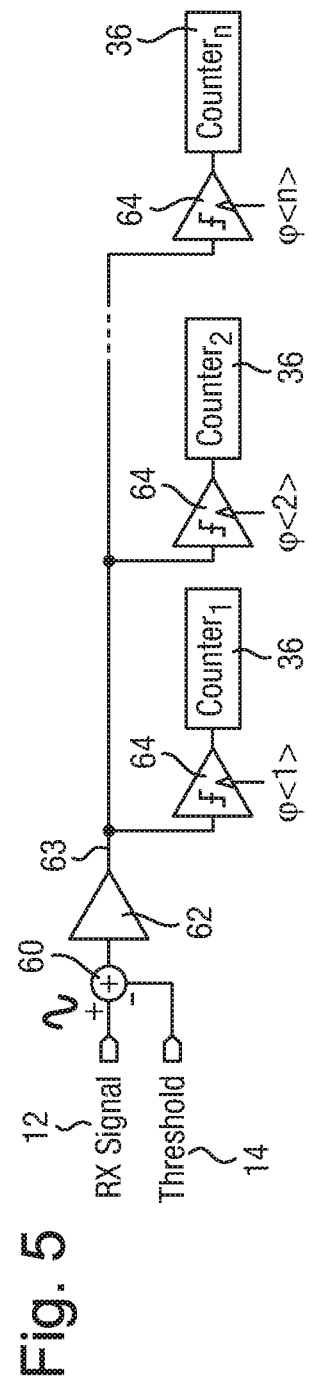
FIG. 5 shows a receiver architecture according to another embodiment of the invention.

FIG. 5 shows a second embodiment of an impulse radar receiver architecture that operates on the swept threshold principle described and illustrated in relation to FIGS. 1a, 1 b, 1c and 2. The received signal (including reflections of the transmitted signal) 12 and a threshold signal 14 are provided as inputs to a difference 60 that outputs the difference between the received signal 12 and the threshold signal 14. This difference signal is input into low gain linear amplifier (buffer) 62 that amplifies the signal, but does not quantize it like the quantizer 10 of FIGS. 2 and 3. Instead, the output of amplifier 62 is continuous in time and continuous in value (whereas the output of quantizer 10 of FIGS. 2 and 3 was continuous time, binary value). As the signal is not pushed to the voltage rails at this point in the signal processing chain, the switching noise is reduced.

The output 63 of amplifier 62 is fanned out to a plurality of parallel samplers 64 in a similar way to the circuit of FIG. 3. Each sampler 64 also performs the quantization necessary to generate a binary value CMOS signal to trigger the counters 36. However, in this embodiment the quantization takes place after the sampling of the amplifier output 63. The important difference here is that the quantization does not need to be performed in continuous time, i.e. the signal does not need to be pushed to one of the voltage rails on such a short timescale (which generates high frequency switching noise). Instead, the amplifier output 63 only needs to be pushed to a voltage rail fast enough to trigger the associated counter 36 before the next sampling event on the associated sampler 64. This can be a much longer time period and allows a slower regenerative amplifier to perform the quantization. Further, this takes place after the sampling and thus any associated switching noise does not affect the sampling, nor does it affect any of the other parallel sampling branches.

The sampler 64 may comprise separate individual circuits for sampling and then amplifying the sampled value. However, in preferred arrangements a combined circuit is used, most preferably a strong-arm latch circuit is used as this conveniently performs sampling and regenerative amplification in a single efficient circuit.

As shown in FIG. 5, the samplers 64 are triggered by the phases <0> to φ<n−1> from multiphase clock 40 shown in FIG. 4 such that each sampler 64 samples a different time point (and hence range point) in the received signal 12.

FIG. 5 shows each sampler 64 having only a single counter 36 and is thus an architecture which is analogous to that of FIG. 2 where all range points are sampled by their own individual sampler 64. However, the principles shown in FIG. 4 may also be applied such that each sampler 64 is provided with a demultiplexer 32 and a plurality of counters 36, with the demultiplexers 32 controlled by a controller 50 in the same way as is described above in relation to FIG. 4.

In the circuits of both FIGS. 4 and 5, the threshold signal 14 is changed over time so as to sweep through a predefined range of voltages. For each threshold voltage level the full range profile is compared and each counter incremented (or not) appropriately. Over the full predefined range of threshold voltages, the counters will gradually build up a value corresponding to the signal level by counting the number of times that the signal 12 was above the threshold 14.

It will be appreciated that while the circuits shown in FIGS. 4 and 5 are single-ended implementations, a differential implementation can also be used. Differential circuits may be preferred for better rejection of coupled noise (such as switching noise). In such implementations a differential signal is conveyed as a positive signal (pos) and an identical but opposite polarity signal (neg), with the signal of interest being the difference between the two, i.e. pos−neg.

The invention claimed is:

1. A range profile digitization circuit for converting a repeating analog input signal into a time series of digital amplitude values, the circuit comprising:
a signal quantizer arranged to receive the analog input signal and a threshold input and arranged to output a binary value quantized output signal based on a comparison of the input signal with the threshold signal;
a plurality of samplers each arranged to sample and hold its input signal upon receipt of a trigger signal; and
for each sampler: a plurality of decoders and a demultiplexer arranged to receive an output from the sampler and pass it to a selected one of said decoders based on a selector input;
wherein a controller is arranged to generate trigger signals for the plurality of samplers and selector inputs for the demultiplexers;
wherein the controller is arranged to generate trigger signals that cycle through the plurality of samplers a plurality of times; and
wherein the controller is arranged to cycle through the demultiplexer selector inputs, changing each demultiplexer's selector input once per cycle of the trigger signals.

2. The range profile digitization circuit as claimed in claim 1,
wherein the controller is arranged to generate the trigger signals at regular time intervals.

3. The range profile digitization circuit as claimed in claim 2, wherein the controller is arranged to generate a continuous stream of trigger signals.

4. The range profile digitization circuit as claimed in claim 1, wherein the samplers are flip-flops.

5. The range profile digitization circuit as claimed in claim 1, wherein a single quantizer is provided upstream of all of the plurality of samplers.

6. The range profile digitization circuit as claimed in claim 1, wherein a plurality of quantizers is provided, each being associated with one or more of the plurality of samplers.

7. A method of range profile digitization for converting a repeating analog input signal into a time series of digital amplitude values, the digitization comprising:
comparing the received analog input signal with a threshold input and quantizing the analog input signal based on said comparison to output a binary value quantized output signal;
sampling the signal by a plurality of samplers each arranged to sample and hold the signal upon receipt of a trigger signal; and
for each sampler: directing the output from the sampler through a demultiplexer to a selected one of a plurality of decoders associated with that sampler based on a demultiplexer selector input;
wherein a controller generates the trigger signals and the demultiplexer selector inputs;
wherein the trigger signals cycle through the plurality of samplers a plurality of times; and
wherein the controller cycles through the demultiplexer selector inputs, changing each demultiplexer's selector input once per cycle of the trigger signals.

* * * * *